United States Patent
Watanabe et al.

(10) Patent No.: US 8,269,569 B2
(45) Date of Patent: Sep. 18, 2012

(54) TEST APPARATUS FOR DIGITAL MODULATED SIGNAL

(75) Inventors: Daisuke Watanabe, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 91 days.

(21) Appl. No.: 12/918,751

(22) PCT Filed: Feb. 20, 2009

(86) PCT No.: PCT/JP2009/000747
§ 371 (c)(1),
(2), (4) Date: Aug. 20, 2010

(87) PCT Pub. No.: WO2009/104420
PCT Pub. Date: Aug. 27, 2009

(65) Prior Publication Data
US 2010/0321127 A1    Dec. 23, 2010

(30) Foreign Application Priority Data
Feb. 21, 2008    (JP) ................... 2008-040378

(51) Int. Cl.
*H04L 27/20*    (2006.01)
(52) U.S. Cl. ........ 332/103; 332/108; 332/149; 329/304; 329/310
(58) Field of Classification Search .................. 332/103, 332/108, 149; 329/304, 310
See application file for complete search history.

(56) References Cited

U.S. PATENT DOCUMENTS

| | | | |
|---|---|---|---|
| 5,175,514 A | * | 12/1992 | Iinuma et al. ................. 332/103 |
| 6,006,072 A | * | 12/1999 | Tsujimoto ..................... 455/63.1 |
| 7,978,009 B2 | * | 7/2011 | Mu ................................ 330/253 |

FOREIGN PATENT DOCUMENTS

| | | |
|---|---|---|
| JP | 04-249946 A | 9/1992 |
| JP | 09-261284 A | 10/1997 |
| JP | 2004-304312 A | 10/2004 |
| JP | 2006-352537 A | 12/2006 |
| JP | 2007-318505 A | 12/2007 |

OTHER PUBLICATIONS

PCT International Search Report for PCT Application No. PCT/JP2009/000747 mailed on Mar. 17, 2009.
PCT International Preliminary Report on Patentability (IPRP) for PCT Application No. PCT/JP2009/000747 issued on Oct. 5, 2010.

* cited by examiner

*Primary Examiner* — Joseph Chang
(74) *Attorney, Agent, or Firm* — Ladas & Parry, LLP

(57) ABSTRACT

A test apparatus includes digital modulators provided in increments of multiple channels. A baseband signal generator performs retiming of data input as a modulation signal for the in-phase (quadrature) component, using a timing signal the timing of which can be adjusted, thereby generating a baseband signal. A driver generates a multi-value digital signal having a level that corresponds to the baseband signal output from the baseband signal generator. A multiplier amplitude-modulates a carrier signal with the multi-value digital signal. An adder sums the output signals of the multipliers.

12 Claims, 8 Drawing Sheets

42a

42b

TEST APPARATUS FOR DIGITAL MODULATED SIGNAL

This application is the U.S. National Stage of International Patent Application No. PCT/JP2009/000747 filed on Feb. 20, 2009, and claims priority thereto, and further claims priority to Japanese Patent Application No. 2008-040378 filed on Feb. 21, 2008 the disclosures of which is hereby incorporated by reference in its entirety.

FIELD OF THE INVENTION

The present invention relates to a digital data transmission technique.

DESCRIPTION OF THE RELATED ART

In conventional digital wired communication, a binary transmission method using time division multiplexing (TDM) has been the mainstream. In this case, high-capacity transmission has been realized by parallel transmission or high-rate transmission. In order to overcome the physical limitations on parallel transmission, serial transmission, which is high-speed transmission, is performed at a data rate of several Gbps to 10 Gbps or more using a high-speed interface (I/F) circuit. However, the data rate acceleration also has a limit, leading to a problem of BER (Bit Error Rate) degradation due to high-frequency loss or reflection in the transmission line.

On the other hand, with the digital wireless communication method, multi-bit information carried by a carrier signal is transmitted and received. That is to say, the data rate is not directly limited by the carrier frequency. For example, in QAM (Quadrature Amplitude Modification), which is the standard quadrature modulation/demodulation method, four-value transmission is provided using a single channel. Furthermore, 64-value QAM provides 64-value transmission using a single carrier. That is to say, such a multi-value modulation method raises the transmission capacity without raising the carrier frequency.

Also, such a modulation/demodulation method can also be applied to wired communication in the same way as with wireless communication. Such a modulation/demodulation method has begun to be applied as the PAM (Pulse Amplitude Modulation) method, QPSK (Quadrature Phase Shift Keying) method, or DQPSK (Differential QPSK) method. In particular, in the filed of optical communication, from the cost perspective, it is important to increase the information carried by a single optical fiber. This has shifted the technology trend from binary TDM to transmission using such digital modulation.

In the near future, such a digital multi-value modulation/demodulation method has the potential to be applied to a wired interface between devices such as memory, SoC (System On a Chip), etc. However, at the present time, there is no known multi-channel test apparatus which is capable of testing such devices for mass production.

Mixed test apparatuses and RF (Radio Frequency) test modules are known, which test a conventional wireless communication device. However, each conventional wireless communication device has a single or several I/O (input/output) communication ports (I/O ports), and thus conventional test apparatuses and test modules include only several communication ports. Accordingly, it is difficult to employ such a test apparatus or a test module to test a device, such as memory, having from tens of to a hundred or more I/O ports.

Furthermore, with the conventional test apparatuses for RF signals, signals output from a DUT (Device Under Test) are A/D (analog/digital) converted, and large amounts of data thus obtained are subjected to signal processing (including software processing) so as to perform expected value judgment. This leads to a long testing time.

Furthermore, digital pins included in conventional test apparatuses are provided, basically assuming that a binary signal (in some cases, a three-value signal further including the high-impedance state (Hi-Z)) is to be tested. That is to say, conventional test apparatuses including such digital pins have no demodulation function for a digitally modulated signal.

In a case in which all the I/O ports of a device such as memory, MPU (Micro Processing Unit), etc., are configured using the digital multi-value modulation method, such a single device has from tens of to a hundred or more I/O ports. Accordingly, there is a need to test such hundreds of I/O ports at the same time. That is to say, there is a need to provide a test apparatus having thousands of channels of I/O ports which allow digitally modulated/demodulated multi-value signals to be input and output. Furthermore, real-time testing at the hardware level is required in all steps due to the CPU resource limits of the test apparatus.

SUMMARY OF THE INVENTION

The present invention has been made in view of such a situation. Accordingly, it is a general purpose of the present invention to provide a test apparatus having a multi-value digital modulation function or a multi-value digital demodulation function. Also, it is another purpose thereof to provide a multi-value digital modulator or a multi-value digital demodulator.

An embodiment of the present invention relates to a test apparatus configured to supply data subjected to digital multi-value modulation to a device under test configured to transmit and receive multiple channels of data subjected to digital multi-value modulation. The test apparatus comprises digital modulators in increments of channels. The digital modulator comprises: a first baseband signal generator configured to perform retiming of first data input as a modulation signal for an in-phase component using a first timing signal the timing of which can be adjusted, so as to generate a first baseband signal; a second baseband signal generator configured to perform retiming of second data input as a modulation signal for a quadrature component using a second timing signal the timing of which can be adjusted, so as to generate a second baseband signal; a first multi-level driver configured to generate a first multi-value digital signal having a level that corresponds to the value of the baseband signal output from the first baseband signal generator; a second multi-level driver configured to generate a second multi-value digital signal having a level that corresponds to the value of the baseband signal output from the second baseband signal generator; a first multiplier configured to amplitude-modulate an in-phase carrier signal with the first multi-value digital signal; a second multiplier configured to amplitude-modulate a quadrature carrier signal with the second multi-value digital signal; and an adder configured to sum the output signals of the first and second multipliers.

A typical test apparatus mounts a pattern generator which is capable of generating a user-desired pattern signal, and a timing generator which is capable of generating a timing signal having a user-desired frequency and user-desired phase characteristics. Thus, by providing the above-described digital modulators in increments of ports (channels) in addition to such an architecture, such an arrangement is capable of supplying data subjected to digital multi-value modulation to a device under test having multi-channel I/O ports without involving an increase in the hardware scale.

Also, the first baseband signal generator may comprise a first data rate setting unit configured to convert the bit rate of first data generated by a pattern generator into a bit rate that corresponds to the first timing signal. The second baseband signal generator may comprise a second data rate setting unit configured to convert the bit rate of second data generated by the pattern generator into a bit rate that corresponds to the second timing signal.

The bit rate of the pattern data generated by the pattern generator is independently set in the test apparatus. Accordingly, the bit rate of the pattern data is not necessarily the same as the bit rate of a signal to be supplied to the DUT. Thus, by generating the first and second timing signals with a frequency that corresponds to the bit rate, such an arrangement is capable of suitably setting the bit rate of the baseband signal.

Also, the first baseband signal generator may comprise a first waveform format controller configured to set a waveform mode for the first baseband signal. The second baseband signal generator may comprise a second waveform format controller configured to set a waveform mode for the second baseband signal.

Examples of such waveform modes include RZ (Return to Zero), NRZ (Non Return to Zero), etc.

Also, the first and second multi-level drivers may be each configured such that the output level can be adjusted. By configuring the multi-level driver such that the output level thereof can be adjusted, such an arrangement is capable of setting the position of a symbol point on a constellation map as desired. Furthermore, such an arrangement is capable of calibrating non-linear distortion that occurs at an analog block provided as a downstream component.

Also, the output level of the first multi-level driver and the output level of the second multi-level driver may be independently adjusted.

With such an arrangement, the amplitude of the in-phase component and the amplitude of the quadrature component can be independently adjusted. For example, such an arrangement is capable of emulating, as desired, IQ amplitude mismatch that occurs in the modulated signal to be supplied to the DUT.

Also, the output level of the first multi-level driver and the output level of the second multi-level driver may be adjusted according to a digital control signal.

Also, the first and second multi-level drivers may be each configured as an M-level ($M=2^N$) driver configured to receive a baseband signal having an N-bit (N represents an integer) differential format. The first and second multi-level drivers may each include N differential amplifiers. Each differential amplifier may comprise: a differential pair configured to receive the baseband signal such that the bits of the baseband signal are input in a differential format; a tail current source configured to bias the differential pair; and an output load circuit for the differential pair. The output load circuit may be shared by the N differential amplifiers. Also, tail currents generated by the tail current sources of the N differential amplifiers may be independently controlled.

With such an embodiment, by changing the tail current supplied from each tail current source, the output level of the multi-level driver can be adjusted.

Also, the first and second multipliers may be each configured such that the gains thereof can be independently adjusted. By setting these gains to different values, such an arrangement is capable of emulating IQ amplitude mismatch.

Alternatively, such an arrangement is capable of canceling out unintended IQ amplitude mismatch.

Also, the test apparatus according to an embodiment may further comprise: an oscillator configured to generate a carrier signal having a carrier frequency; and a phase shifter configured to shift the phase of the carrier signal generated by the oscillator so as to generate the in-phase carrier signal and the quadrature carrier signal.

Also, the phase shifter may be configured such that the phase difference between the in-phase carrier signal and the quadrature carrier signal can be adjusted. Such an arrangement is capable of emulating the IQ phase mismatch. Alternatively, such an arrangement is capable of emulating the IQ phase mismatch. Alternatively, such an arrangement is capable of canceling out unintended IQ phase mismatch.

Also, the in-phase carrier signal and the quadrature carrier signal may be each generated in the form of a rectangular pulse signal. Such an arrangement is capable of more easily generating the carrier signals than an arrangement configured to generate the carrier signals in the form of sinusoidal wave signals.

Also, the test apparatus according to an embodiment may further comprise: a direct digital synthesizer configured to digitally generate a user-desired signal waveform; and a digital/analog converter configured to perform digital/analog conversion of the output data output from the direct digital synthesizer, and to generate the in-phase carrier signal and the quadrature carrier signal.

Such an arrangement is capable of controlling the phase difference between the in-phase carrier signal and the quadrature carrier signal by means of digital signal processing. Thus, such an arrangement provides a reduced circuit scale.

Also, the test apparatus according to an embodiment may further comprise a timing generator configured to generate a pulse signal having a frequency and a level transition timing which can be set as desired. With such an arrangement, the in-phase carrier signal and the quadrature carrier signal may be generated by means of the timing generator.

By generating the in-phase carrier signal and the quadrature carrier signal in the form of rectangular pulse signals, such an arrangement is capable of directly generating the carrier signals by means of the timing generator.

Another embodiment of the present invention relates to a digital modulator. The digital modulator comprises: a first baseband signal generator configured to perform, using a first timing signal, retiming of first data input as a modulation signal for an in-phase component so as to generate a first baseband signal; a second baseband signal generator configured to perform, using a second timing signal, retiming of second data input as a modulation signal for a quadrature component so as to generate a second baseband signal; a first multi-level driver configured to generate a first multi-value digital signal having a level that corresponds to the value of the baseband signal output from the first baseband signal generator; a second multi-level driver configured to generate a second multi-value digital signal having a level that corresponds to the value of the baseband signal output from the second baseband signal generator; a first multiplier configured to amplitude-modulate an in-phase carrier signal with the first multi-value digital signal; a second multiplier configured to amplitude-modulate a quadrature carrier signal with the second multi-value digital signal; and an adder configured to sum the output signals of the first and second multipliers.

Yet another embodiment of the present invention relates to a semiconductor apparatus. The semiconductor apparatus comprises: a function device having multiple input/output ports; and multiple digital modulators described above, which are configured to digitally modulate the data output via the input/output ports of the function device, and to output the data thus digitally modulated to an external circuit.

Yet another embodiment of the present invention relates to a test apparatus configured to receive data subjected to digital multi-value modulation, from a device under test configured to transmit and receive multi-channel data subjected to digital multi-value modulation. The test apparatus comprises digital demodulators in increments of channels. With such an arrangement, the digital demodulator comprises: a third multiplier configured to perform down-conversion of the data thus received using an in-phase detection signal; a fourth multiplier configured to perform down-conversion of the data thus received using a quadrature detection signal; a first comparator configured to compare a third multi-value digital signal output from the third multiplier with at least one predetermined threshold voltage; a second comparator configured to compare a fourth multi-value digital signal output from the fourth multiplier with at least one predetermined threshold voltage; a first latch circuit configured to latch a third digital baseband signal output from the first comparator using a third timing signal, the timing of which can be adjusted; and a second latch circuit configured to latch a fourth digital baseband signal output from the second comparator using a fourth timing signal, the timing of which can be adjusted. The test apparatus compares the data thus latched by the first and second latches with expected value data.

A typical test apparatus mounts a timing generator which is capable of generating a timing signal having a desired frequency and desired phase characteristics. Thus, by providing the above-described digital demodulators in increments of ports (channels) in addition to such an architecture, a demodulation function can be implemented for each channel without involving an increase in the hardware scale.

Also, the first and second comparators may be each configured such that the threshold voltages thereof can be adjusted. Furthermore, the threshold voltage of the first comparator and the threshold voltage of the second comparator may be independently adjusted.

Also, the first and second multi-level drivers may be configured such that the threshold voltages thereof can be adjusted according to a digital control signal.

Also, the third and fourth multipliers may be each configured such that the gains thereof can be independently adjusted.

It could become mainstream in the future for a test apparatus to have a function of adaptively adjusting IQ mismatch that occurs in a quadrature modulation communication system, as with the conventional adaptive equalizing control method. In this case, by independently adjusting the gains of these multipliers, such an arrangement allows the test apparatus to emulate a correction operation for IQ amplitude mismatch in the test operation. Alternatively, in a case in which it is desired to remove IQ amplitude mismatch in a particular test environment, such an arrangement is capable of canceling out the IQ amplitude mismatch.

Also, the test apparatus according to an embodiment may further comprise: an oscillator configured to generate a detection signal having a carrier frequency; and a phase shifter configured to shift the phase of the detection signal generated by the oscillator, and to generate the in-phase detection signal and the quadrature detection signal.

Also, the phase shifter may be configured to be capable of adjusting the phase difference between the in-phase detection signal and the quadrature detection signal.

In this case, such an arrangement allows the test apparatus to emulate a correction operation for IQ phase mismatch in the test operation. Alternatively, in a case in which it is desired to remove IQ phase mismatch in a particular test environment, such an arrangement is capable of canceling out the IQ phase mismatch.

Also, the in-phase detection signal and the quadrature detection signal may be each generated in the form of a rectangular pulse signal. Such an arrangement is capable of generating the detection signals more easily than an arrangement configured to generate the detection signals in the form of sinusoidal wave signals.

Also, the test apparatus according to an embodiment may further comprise: a direct digital synthesizer configured to digitally generate a user-desired signal waveform; and a digital/analog converter configured to perform digital/analog conversion of the output data output from the direct digital synthesizer, and to generate the in-phase detection signal and the quadrature detection signal.

Such an arrangement is capable of controlling the phase difference between the in-phase detection signal and the quadrature detection signal by means of digital signal processing. Thus, such an arrangement provides a reduced circuit scale.

Also, the test apparatus according to an embodiment may further comprise a timing generator configured to generate a pulse signal having a frequency and a level transition timing which can be adjusted. With such an arrangement, the in-phase detection signal and the quadrature detection signal may be generated by means of the timing generator.

By generating the in-phase detection signal and the quadrature detection signal in the form of rectangular pulse signals, such an arrangement is capable of directly generating the detection signals by means of the timing generator.

Yet another embodiment of the present invention relates to a digital demodulator. The digital demodulator comprises: a third multiplier configured to perform down-conversion of received data using an in-phase detection signal; a fourth multiplier configured to perform down-conversion of received data using a quadrature detection signal; a first comparator configured to compare a third multi-value digital signal output from the third multiplier with at least one predetermined threshold voltage; a second comparator configured to compare a fourth multi-value digital signal output from the fourth multiplier with at least one predetermined threshold voltage; a first latch circuit configured to latch a third digital baseband signal output from the first comparator using a third timing signal having a timing which can be adjusted; and a second latch circuit configured to latch a fourth digital baseband signal output from the second comparator using a fourth timing signal having a timing which can be adjusted.

Yet another embodiment of the present invention relates to a semiconductor apparatus. The semiconductor apparatus comprises: a function device having multiple input/output ports; and multiple digital demodulators described above, which are configured to demodulate data input from an external circuit, and to output the data thus demodulated to the corresponding port of the function device.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
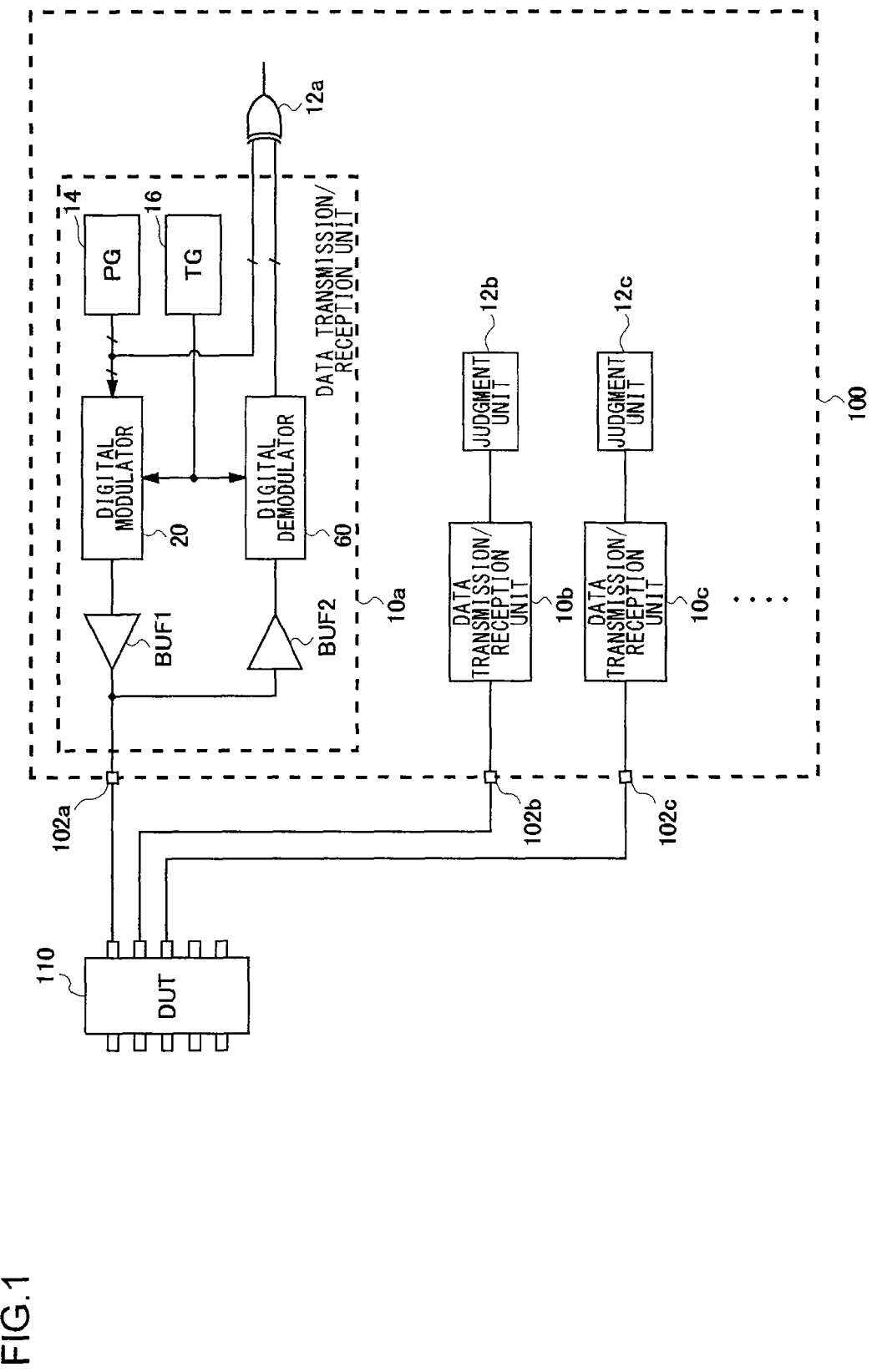
FIG. 1 is a block diagram which shows an overall configuration of a test apparatus according to an embodiment of the present invention.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

The test target to be tested by a test apparatus according to an embodiment is a device under test (DUT) including a transmission/reception interface for digitally multi-value modulated (which will simply be referred to as "digitally modulated" hereafter) digital data. That is to say, a pattern signal is digitally modulated, and the pattern signal thus digitally modulated is supplied to the DUT. Furthermore, the digitally modulated data output from the DUT is demodulated, and the data thus demodulated is compared with an expected value so as to perform quality judgment. The test apparatus may include a waveform analysis function for the data thus digitally modulated, a function of generating a constellation map, etc., in addition to the quality judgment function.

Digital modulation includes QAM (quadrature amplitude modulation), QPSK (quadrature phase shift keying), and BPSK (binary phase shift keying), etc. The DUT is assumed to be a device having a multi-channel I/O port such as memory or an MPU. However, the DUT is not restricted in particular.

FIG. 1 is a block diagram which shows an overall configuration of a test apparatus 100 according to an embodiment of the present invention. The test apparatus 100 shown in FIG. 1 includes multiple I/O terminals 102a, 102b, 102c, and so on, in increments of the I/O ports of the DUT. The number of I/O ports is not restricted in particular. In a case in which the DUT1 is memory or an MPU, tens of to a hundred or more I/O ports PIO are provided. The multiple I/O terminals 102 of the test apparatus 100 are connected to the corresponding I/O ports of the DUT 110 via a transmission path.

The test apparatus 100 includes multiple data transmission/reception units 10a, 10b, 10c, and so on, and multiple judgment units 12a, 12b, 12c, and so on, respectively provided for the multiple I/O terminals 102a, 102b, 102c, and so on. The multiple data transmission/reception units 10 have the same configuration, and the multiple judgment units 12 have the same configuration. Accordingly, detailed description will be made only regarding the configuration of the data transmission/reception unit 10a and the configuration of the judgment unit 12a.

Each data transmission/reception unit 10 has: a function of digitally modulating a carrier signal (carrier wave) with pattern data to be supplied to the DUT 110 as the modulation signal, and outputting the resulting signal to the corresponding I/O port of the DUT 110; and a function of receiving modulated data output from the DUT 110, and demodulating the modulated data thus received. The data thus demodulated is compared with an expected value, thereby judging the quality of the DUT 110.

Each data transmission/reception unit 10 includes a pattern generator 14, a timing generator 16, an output buffer BUF1, an input buffer BUF2, a digital modulator 20, and a digital demodulator 60.

The pattern generator 14 generates a test pattern to be supplied to the DUT 110. Each data (which will also be referred to as the "pattern data") of the test pattern has bits the number of which corresponds to the digital modulation/demodulation format used to perform data transmission between the DUT 110 and the test apparatus 100. For example, in a case in which the 16QAM is employed, each data is 4-bit data. In a case in which 64QAM is employed, each data is 6-bit data. In a case in which QPSK is employed, 2-bit data is employed. In a case in which BPSK is employed, 1-bit data is employed. Description will be made below regarding an arrangement in which the 16QAM is employed, for example, in order to facilitate understanding. That is to say, the pattern generator 14 generates 4-bit pattern data.

The timing generator 16 generates a timing signal, and outputs the timing signal thus generated to the digital modulator 20. The timing generator 16 is capable of performing fine adjustment, i.e., on the order of several ps to several ns, of the phase of the timing signal in increments of cycles of the pattern data. Known circuits employed in a test apparatus used to test conventional systems configured to perform binary transmission may be employed as the pattern generator 14.

The digital modulator 20 performs quadrature amplitude modulation (e.g., 16QAM) of a carrier with the pattern data as the modulation signal. The signal thus modulated is output to the DUT 110 via the output buffer BUF1. Description will be made later regarding the relation between the modulation processing performed by the digital modulator 20 and the timing signal.

The input buffer BUF2 receives a modulated signal output from the DUT 110, and outputs the modulated signal thus received to the digital demodulator 60. The digital demodulator 60 demodulates the modulated data, and extracts digital data. The judgment unit 12a compares the data thus demodulated by the digital demodulator 60 with expected value data output from the pattern generator 14. The output buffer BUF1 and the input buffer BUF2 may also be configured as a single two-way buffer.

The above is the overall configuration of the test apparatus 100 and the schematic operation thereof. As described above, the test apparatus 1 must perform processing of tens of to a hundred or more data items, and includes a data transmission/reception unit 10 for each input/output port. Accordingly, there is a need to design the data transmission/reception units 10 such that they are integrally formed on a semiconductor substrate using the CMOS process or other processes.

Detailed description will be made below regarding the configurations of the digital modulator 20 and the digital demodulator 60.

First, description will be made regarding the configuration of the digital modulator.

Figure 2:
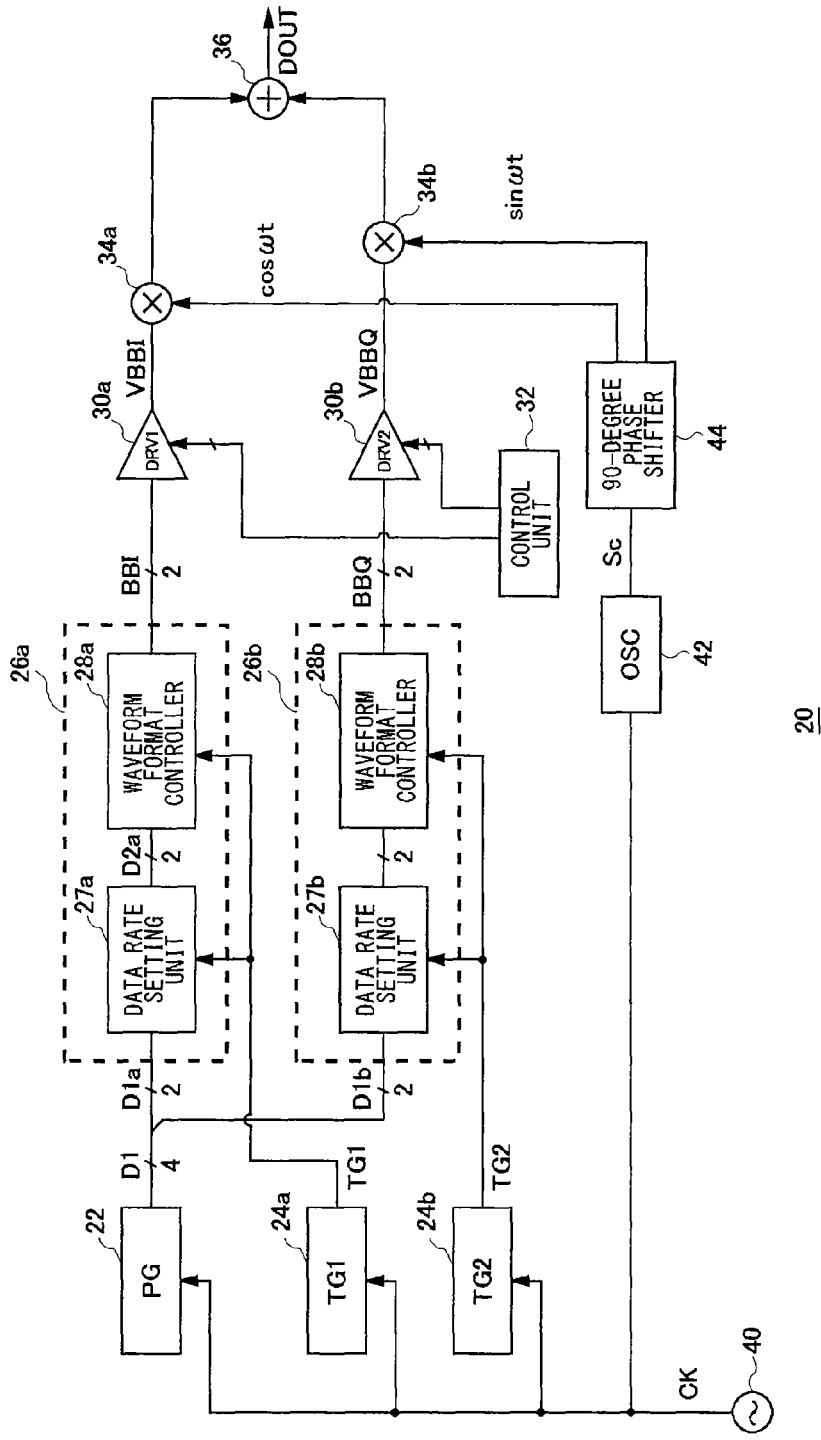
FIG. 2 is a block diagram which shows a configuration of a digital modulator according to an embodiment.

FIG. 2 is a block diagram which shows the configuration of the digital modulator 20 according to an embodiment. The digital modulator 20 includes a pattern generator 22, a first timing generator 24a, a second timing generator 24b, and a first baseband signal generator 26a, a second baseband signal generator 26b, a first multi-level driver (which will simply be referred to as the "first driver" hereafter) 30a, a second multi-level driver (which will simply be referred to as the "second driver" hereafter) 30b, a driver level control unit 32, a first multiplier 34a, a second multiplier 34b, an adder 36, a reference signal source 40, an oscillator 42, and a 90-degree phase shifter 44. In FIG. 2, units with an appended lowercase letter "a" are units configured to process the in-phase component, and units with an appended lowercase letter "b" are units configured to process the quadrature component. The pattern generator 22 corresponds to the pattern generator 14 shown in FIG. 1, and the timing generator 24 corresponds to the timing generator 16 shown in FIG. 1.

The pattern generator 22 generates the pattern data to be supplied to the DUT 110. The number of bits set for the signal lines shown in FIG. 2 is determined based upon 16QAM as an example. However, the present invention is not restricted to such an arrangement using such a number of bits.

First data D1a, which is 2-bit data, that corresponds to the in-phase component of the pattern data D1 is input to the first baseband signal generator 26a. Second data D2b, which is 2-bit data, that corresponds to the quadrature component is input to the second baseband signal generator 26b. The reference signal source 40 generates a clock signal CK, and outputs the clock signal CK thus generated to the first timing generator 24a, the second timing generator 24b, and the oscillator 42.

The first timing generator 24a receives the clock signal CK, and generates a first timing signal TG1 the level of which is switched at a user-desired timing using the clock signal CK thus received. That is to say, the first timing signal TG1 is an edge sequence, the edge pitch of which can be adjusted as desired. Furthermore, the first timing generator 24a is capable of adjusting the frequency of the first timing signal TG1 as desired.

The first baseband signal generator 26a generates a first baseband signal BBI using the first data D1a that corresponds to the in-phase component and the first timing signal TG1. Specifically, the first baseband signal generator 26a includes a first data rate setting unit 27a and a second waveform format controller 28b.

The first data D1 generated by the pattern generator 22 has a data rate which is synchronized to the reference clock for the overall operation of the test apparatus 100. However, the data rate of the first data D1 is not necessarily the same as the data rate to be supplied to the DUT 110. In order to solve such a problem, the first data rate setting unit 27a sets the data rate of the baseband signal BBI to a suitable data rate required by the DUT 110 using the timing edge sequence (TG1) output from the first timing generator 24a. That is to say, the first data rate setting unit 27a executes retiming processing in which the data rate of the first data D1a set by the pattern generator 22 is converted into a suitable data rate to be supplied to the DUT 110.

The first data D2a having such a suitable data rate thus set is input to the first waveform format controller 28a. The first waveform format controller 28a is a circuit block configured to set the waveform mode to be applied to the pattern data D2a provided as a binary data signal. Specifically, the first waveform format controller 28a sets the waveform mode to a predetermined waveform mode selected from among waveform modes such as RZ, NRZ, etc. The first data rate setting unit 27a and the second data rate setting unit 27b may be configured as an SR latch, flip-flop, or the like. The configuration of the second data rate setting unit 27b is not restricted in particular.

As described above, such an arrangement generates the first baseband signal BBI having a predetermined data rate and a predetermined waveform mode.

The second timing generator 24b and the second baseband signal generator 26b generate a second baseband signal BBQ using the second data D1b and the second timing signal TG2 in the same way as the first timing generator 24a and the first baseband signal generator 26a.

The timings of the timing signals TG1 and TG2 can each be set as desired. Thus, a test apparatus mounting the digital modulator 20 according to the embodiment is capable of applying a desired jitter to the baseband signal.

Furthermore, the first timing generator 24a and the second timing generator 24b are capable of independently setting the edge timings of the timing signals TG1 and TG2 to desired values in increments of pulses. That is to say, by individually adjusting the timings of the timing signals TG1 and TG2, such an arrangement is capable of applying a desired jitter to a bit sequence included in each of the baseband signals BBI and BBQ, thereby allowing the DUT 110 to be tested in various situations.

The first driver 30a is a multi-level driver configured to convert the baseband signal BBI generated by the first baseband signal generator 26a into a signal (which will be referred to as the "multi-value digital signal VBBI") having a voltage level that corresponds to the value of the baseband signal BBI. Specifically, when 16QAM is employed, the first driver 30a may be configured as a four-value driver. When 64QAM is employed, the first driver 30a may be configured as an eight-value driver. When QPSK or BPSK is employed, the first driver 30a may be configured as a binary driver. In general, when the first driver 30a outputs an M-valued (M represents an integer) signal, the first driver 30a selects one of the reference voltages Vi1 through ViM according to the value of the baseband signal BBI, and outputs the reference voltage thus selected.

In the same way, the second driver 30b outputs one of the reference voltages Vq1 through VqM according to the value of the baseband signal BBQ.

The first driver 30a is configured so as to allow the reference voltages Vi1 through ViM to be adjusted. The second driver 30b is configured so as to allow the reference voltages Vq1 through VqM to be adjusted. The driver level control unit 32 outputs control data which instructs the first driver 30a and the second driver 30b to control the reference voltages Vi1 through ViM, and Vq1 through VqM.

By means of the reference voltages Vi1 through ViM and the reference voltages Vq1 through VqM being adjustable, such an arrangement provides the following advantages.

First, such an arrangement is capable of independently setting the amplitude VBBI of the in-phase component and the amplitude VBBQ of the quadrature component as desired, thereby setting the positions of the symbol points on a constellation map as desired.

Second, such an arrangement is capable of calibrating non-linear distortion that occurs at the first multiplier 34a, the second multiplier 34b, and the adder 36, which are provided as a downstream analog block. That is to say, by applying pre-distortion to the first driver 30*a* and the second driver 30*b* giving consideration to the distortion that occurs at the downstream components, such an arrangement is capable of supplying modulated data with low distortion to the DUT 110.

Furthermore, such an arrangement is preferably capable of independently adjusting the reference voltages Vi1 through ViM and the reference voltages Vq1 through VqM.

Such an arrangement is capable of emulating, as desired, IQ amplitude mismatch that occurs in the modulated signal to be supplied to the DUT 110. That is to say, in order to test the receiver performance of the DUT 110, such an arrangement is capable of applying intentional distortion to the modulated signal, and of testing the tolerance for such distortion. Also, such an arrangement is capable of canceling out undesired IQ amplitude mismatch.

Figure 3:
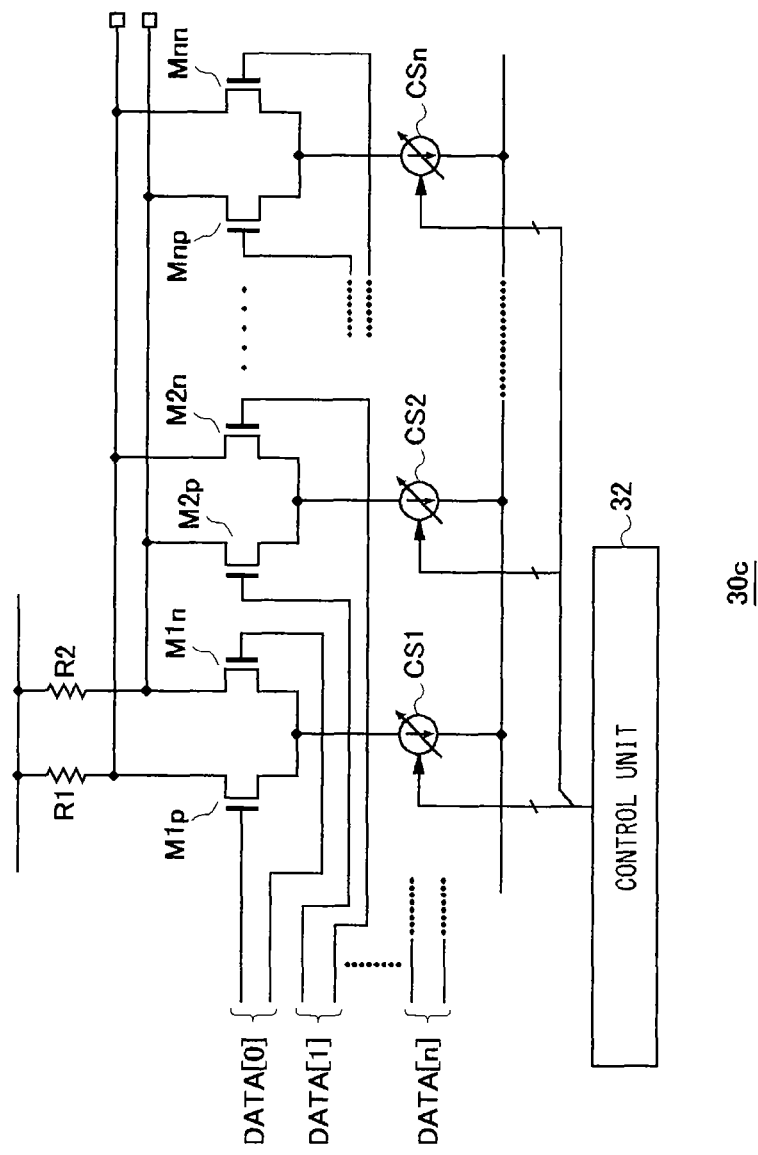
FIG. 3 is a circuit diagram which shows an example configuration of a multi-level driver which can be employed as a first driver and a second driver.

FIG. 3 is a circuit diagram which shows an example configuration of a multi-level driver which can be employed as the first driver 30*a* or the second driver 30*b*. The multi-level driver 30*c* includes multiple differential amplifiers. An M-level driver receives N (here, $M=2^N$) input data items DATA in the form of a differential signal. The data DATA[0:n] shown in FIG. 3 corresponds to each bit of the baseband signals BBI or BBQ shown in FIG. 2.

The multiple differential amplifiers are connected in parallel such that they are connected to common output load circuits R1 and R2. Instead of the load resistors R1 and R2, a current mirror circuit may be employed as an output load circuit. The i-th differential amplifier includes a differential pair Mip and Min, a tail current source Csi, and load resistors R1 and R2. The drains of the multiple transistors configured as differential pairs are connected together. The signals output from the drains thus connected together are output as a differential signal to the multipliers 34*a* and 34*b* provided as downstream components. It should be noted that the multi-level driver may be configured as a single-ended circuit. Also, the multi-level driver may be configured employing a P-channel MOSFET. Also, desired known circuits may be employed.

The tail current sources CS1 through CSn are each configured as a current DA converter. That is to say, each of the tail current sources CS1 through CSn supplies a tail current (bias current) to the corresponding differential pair according to a received input signal. By adjusting the tail currents generated by the tail current sources CS1 through CSn, such an arrangement is capable of adjusting the output level of the multi-level driver 30*c*, i.e., the reference voltages Vi1 through ViM, and the reference voltage Vq1 through VqM, as desired.

The driver level control unit 32 digitally controls the values of the tail current sources CS1 through CSn. That is to say, the driver level control unit 32 and the tail current sources CS1 through CSn form a current DAC.

As a multi-level driver, a DA converter may be employed.

Figure 4A:
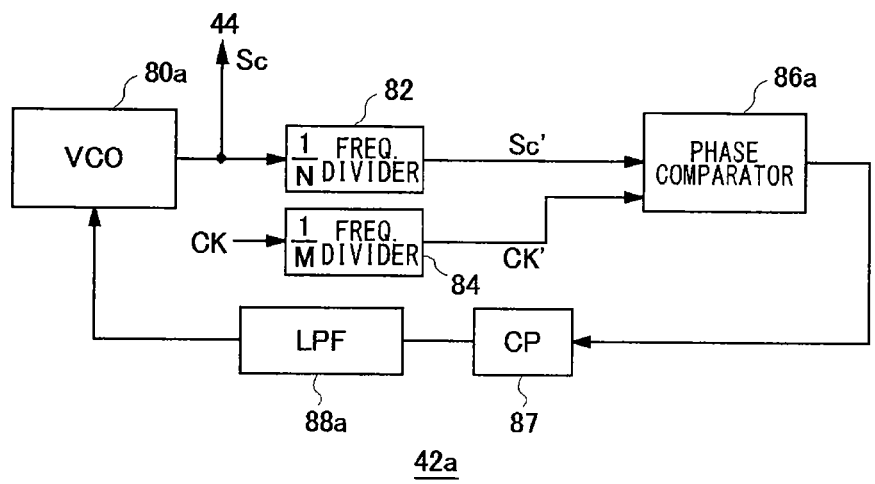
FIGS. 4A and 4B are circuit diagrams which show an analog PLL and a digital PLL.
Figure 4B:
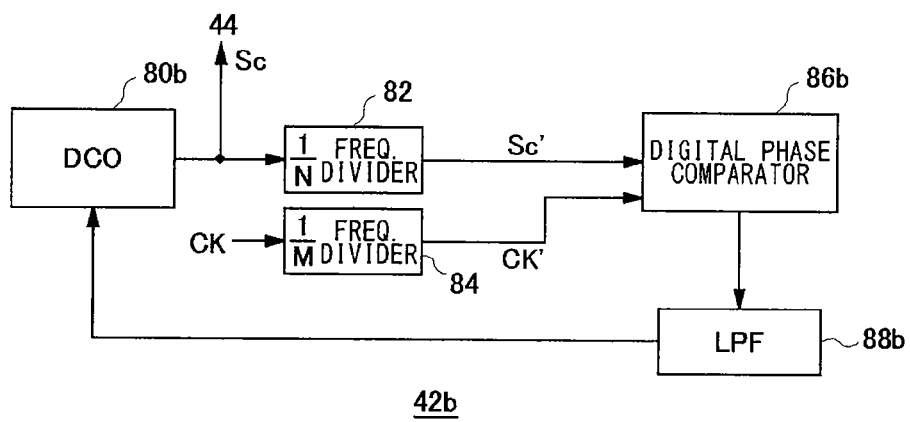

Returning to FIG. 2, the oscillator 42 generates a carrier signal Sc having a carrier frequency fc. The oscillator 42 may be configured as a PLL (Phase Locked Loop) using the clock signal CK as a reference clock. Whether the PLL is analog or digital is not restricted in particular. FIGS. 4A and 4B are circuit diagrams which show a configuration of an analog PLL and a configuration of a digital PLL.

An analog PLL 42*a* shown in FIG. 4A includes a VCO (Voltage Controlled Oscillator) 80*a*, a first divider 82, a second divider 84, a phase comparator 86*a*, a charge pump circuit 87, and a loop filter 88*a*. The VCO 80*a* oscillates at a frequency that corresponds to an input voltage. The output signal of the VCO 80*a* is output as the carrier signal Sc. Furthermore, the output signal of the VCO 80*a* is divided by N (N represents an integer) by the first divider 82. The second divider 84 divides the clock signal CK by M (M represents an integer). The phase comparator 86*a* compares the edge timing of the carrier signal Sc' thus divided with the edge timing of the clock signal CK' thus divided, i.e., makes a comparison between the phases thereof, and generates a pulse signal having a level that corresponds to the phase difference thus obtained. The charge pump circuit 87 outputs an analog voltage having a voltage level that corresponds to the level of the pulse signal. The high-frequency component of the analog voltage thus output is removed by the loop filter 88*a*, and is supplied as a control voltage for the VCO 80*a*. With the PLL circuit 42*a*, the frequency of the carrier signal Sc is stabilized at a value which is proportional to the frequency of the clock signal.

In a case in which the analog PLL 42*a* shown in FIG. 4A is employed, the circuit area becomes large due to the circuit area of the loop filter 88*a* and the oscillator. In a case in which a reduced circuit scale is desired, a digital PLL 42*b* shown in FIG. 4B may be employed. The digital PLL 42*b* has a fully digital configuration obtained by replacing the VCO 80 shown in FIG. 4A with a digital controlled oscillator (DCO), and by replacing the phase comparator 86*a* shown in FIG. 4A with a digital phase comparator 86*b*. The DCO 80*b* is configured to oscillate at a discrete frequency selected according to an input digital signal. For example, a circuit is known in which a capacitor of an LC tank circuit is configured as a capacitor array, and the number of active capacitor cells is controlled by means of a digital control operation.

The digital phase comparator 86*b* outputs a control signal which represents the digital value that corresponds to the phase difference between the divided clock signal CK' and the divided carrier signal Sc'. The digital phase comparator 86*b* can be configured employing a time to digital converter (TDC) using a vernier delay circuit method or the like. The digital filter 88*b* performs filtering of the output signal of the digital phase comparator 86*b* by means of digital signal processing, and outputs the signal thus filtered to the DCO 80*b*.

Returning to FIG. 2, the 90-degree phase shifter can be configured as a passive circuit configured to perform an arctangent transformation of the carrier signal Sc, or can be configured as a Hilbert transform circuit. The 90-degree phase shifter 44 outputs two carrier signals, i.e., an in-phase carrier signal cos ωt and a quadrature carrier signal −sin ωt such that the phases thereof are perpendicular to one another.

The first multiplier 34*a* multiplies the multi-value digital signal VBBI output from the first driver 30*a* with the in-phase carrier signal cos ωt (mixing). That is to say, the in-phase carrier signal cos ωt is amplitude-modulated, with the multi-value digital signal VBBI as the modulation signal. Furthermore, the second multiplier 34*b* multiplies the multi-value digital signal BBQ with the quadrature carrier signal −sin ωt. That is to say, the quadrature carrier signal −sin ωt is amplitude-modulated, with the multi-value digital signal VBBQ as the modulation signal.

The first multiplier 34*a* and the second multiplier 34*b* may be configured as a typical double balanced mixer (DBM) or as a Gilbert-cell mixer. Preferably, the first multiplier 34*a* and the second multiplier 34*b* each have adjustable gains which can be adjusted independently. By configuring the first multiplier 34*a* and the second multiplier 34*b* such that they have programmable gains, such an arrangement is capable of emulating IQ amplitude mismatch. Also, such an arrangement is capable of canceling out IQ amplitude mismatch.

The adder 36 sums the output signal of the first multiplier 34*a* and the output signal of the second multiplier 34*b*, thereby generating a composite signal. The adder 36 may be configured as the multi-level driver 30*c* shown in FIG. 3 such that it includes two differential circuits. With such an arrangement, the output signal of the first multiplier 34a is supplied to one input terminal of the multi-level driver 30c thus configured, and the output signal of the second multiplier 34b is supplied to the other input terminal thereof. In a case in which the adder 36 is configured as such a circuit shown in FIG. 3, by configuring the tail current sources CS to provide programmable current values, such an arrangement is capable of emulating IQ amplitude mismatch. The configuration of the adder 36 is not restricted to such an arrangement. Also, adder circuits employing resistors or operational amplifiers may be employed.

The above is the configuration of the digital modulator 20. Although the digital modulator 20 according to the embodiment has a simple configuration, it is capable of generating data DOUT modulated in a 16QAM format or similar formats.

If a test apparatus having the same functions is configured using a conventional architecture, first, 16QAM data is generated by means of a DSP (Digital Signal Processor), and the digital data thus generated is DA converted by means of a DA converter. However, with such a test apparatus, there is a need to generate a modulated signal for each port. Accordingly, there is a need to provide a DSP for each port, which requires an enormous amount of hardware resources. Thus, it does not serve any practical purpose to design such an arrangement. Furthermore, such an arrangement has a problem in that, if the carrier frequency is in the GHz band, such an arrangement requires an extremely high-speed DA converter. In contrast, with the digital modulator 20 according to the embodiment, the operation speed of the first driver 30a and the second driver 30b preferably follow the bit rate of the baseband signal. That is to say, such an such an arrangement does not require the first driver 30a and the second driver 30b to be responsive to the carrier frequency. This provides a simple circuit configuration.

The digital modulator 20 according to the embodiment has a remarkably simple configuration. Thus, with such an arrangement, hundreds of channels of such digital modulators can be integrated on a single semiconductor substrate or multiple semiconductor substrates using the CMOS process in a simple manner.

Description has been made in the embodiment regarding an arrangement employing 16QAM. Also, the circuit shown in FIG. 2 is capable of generating data modulated in various formats such as QPSK, BPSK, offset QPSK, DPSK, shift PSK, etc. For example, in a case in which QPSK is employed, an arrangement may be made in which the pattern generator 22 generates 2-bit data, one bit of the data thus generated is supplied to the first baseband signal generator 26a, and the other one bit is supplied to the second baseband signal generator 26b. With such an arrangement, the first driver 30a and the second driver 30b each function as a binary driver, thereby generating data modulated in the QPSK format. In a case in which BPSK is employed, only the first baseband signal generator 26a and the first driver 30a should be operated.

By performing encoding processing by means of the pattern generator 22, such an arrangement supports DPSK modulation.

In a case in which multi-value QAM such as 64QAM or the like is employed, the number of bits of the digital modulator 20 shown in FIG. 2 should be increased. For example, when 6-bit data D1 is generated by means of the pattern generator 22, 3 bits are supplied to the first baseband signal generator 26a, and 3 bits are supplied to the second baseband signal generator 26b. Furthermore, by configuring each of the first driver 30a and the second driver 30b as an 8-value driver, such an arrangement is capable of generating 64QAM data.

The multi-value QAM digital modulator may be configured as a combination of multiple 16QAM digital modulators 20 shown in FIG. 2. For example, a 64QAM digital modulator may be configured as a combination of three 16QAM digital modulators 20. With such an arrangement, the output signals of the three 16QAM digital modulators 20 are combined by means of an adder.

Next, description will be made regarding a modification of the digital modulator 20.

Figure 5:
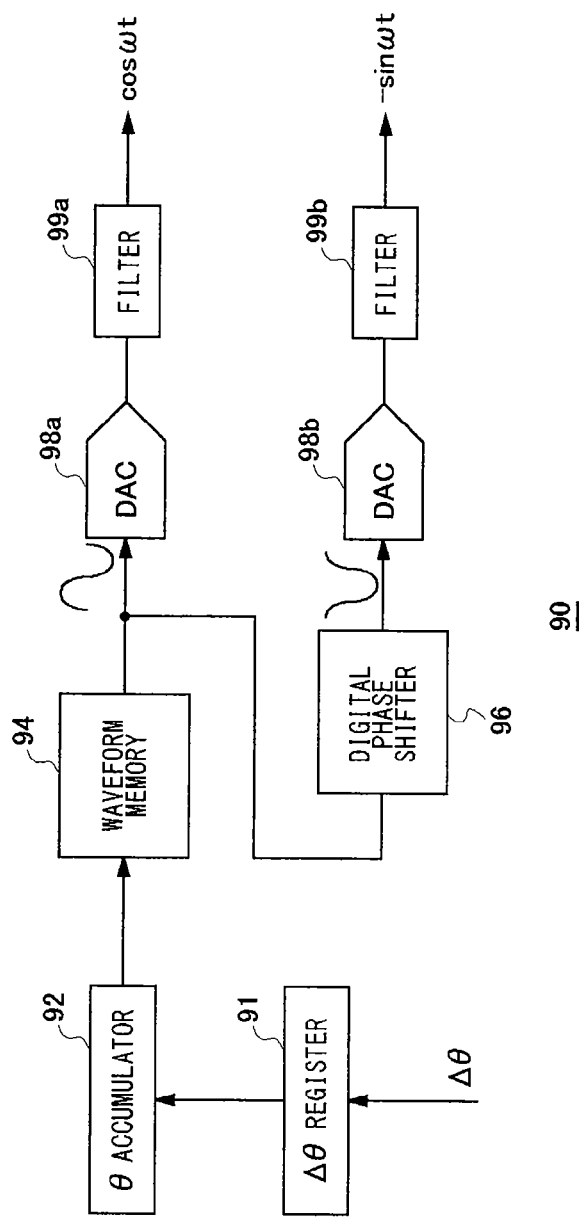
FIG. 5 is a block diagram which shows an example configuration of a DDS.

Instead of employing the oscillator 42 and the 90-degree phase shifter 44, a user-desired signal waveform may be digitally generated. In this case, a direct digital synthesizer (DDS) can be suitably employed. FIG. 5 is a block diagram which shows an example configuration of the DDS.

The DDS 90 shown in FIG. 5 includes a Δθ register 91, a θ accumulator 92, waveform memory 94, a digital phase shifter 96, DA converters 98a and 98b, and filters 99a and 99b.

The waveform memory 94 stores a function or data that corresponds to a desired waveform such as a sinusoidal waveform. The frequency of the signal read out from the waveform memory 94 is defined by phase increment data Δθ written to the Δθ register 91. The θ accumulator 92 cumulatively sums the phase increment data Δθ. The waveform memory 94 outputs, in the form of digital values, the waveform defined by the frequency that corresponds to the accumulated data (which will be referred to as the "phase data") θ. The output signal of the waveform memory 94 is converted into an analog signal by means of the DA converter 98. Quantization error that occurs at the DA converter 98 is smoothed by means of the filter 99a provided as a downstream component, thereby generating the in-phase carrier signal cos ωt.

The digital phase shifter 96 digitally shifts the phase of the output signal (sinusoidal wave), read out from the waveform memory 94, by 90 degrees. By using address shifting of the waveform memory, or by using cycle shifting of the phase data θ, such an arrangement provides such shifting using only a logic circuit. With such an arrangement, the phase shift angle can be adjusted as desired. The quadrature carrier signal −sin ωt is generated by means of the DA converter 98b and the filter 99b provided as downstream components.

Each of the filters 99a and 99b essentially includes an analog component. However, by raising the resolution of the phase increment data Δθ, such an arrangement provides the same function without involving a filter, using only the high-frequency loss due to parasitic resistance and parasitic capacitance that occurs in the circuit. That is to say, the DDS 90 having such a fully digital configuration is capable of generating an in-phase component carrier signal and a quadrature component carrier signal.

It should be noted that the timing generator included in the test apparatus 100 includes a circuit configured to adjust the phase accumulator or the phase resolution. Thus, a timing generator having the same functions as those of the timing generator mounted in the test apparatus 100 may be employed instead of the Δθ register 91 and the θ accumulator 92.

With the DDS 90 shown in FIG. 5, the timing of the data input to the DA converters 98a and 98b can be adjusted as desired using the digital phase shifter 96. Thus, such an arrangement is capable of setting the quadrature relation (IQ phase mismatch) between the in-phase carrier signal and the quadrature carrier signal as desired.

In a case in which the 90-degree phase shifter 44 configured as an analog circuit is employed as shown in FIG. 2, changes in the phase lead to changes in the amplitude. Accordingly, such an arrangement has a problem in that unintended amplitude mismatch can occur. In contrast, with the DDS 90 shown in FIG. 5, the 90-degree phase shifting operation can be performed using digital signal processing, thereby suppressing amplitude mismatch when the phase is shifted.

Description has been made in the embodiment regarding an arrangement in which the in-phase component of the carrier signal and the quadrature component thereof are each generated in the form of a sinusoidal wave by means of the digital modulator 20. Also, these component carrier signals may be each generated in the form of a rectangular wave. It is known that the PSK data modulated using a pulse signal instead of a sinusoidal wave signal can be demodulated using a pulse signal. Also, it is known that the PSK data modulated by a pulse signal can be demodulated using a sinusoidal wave signal or a pulse signal.

Figure 6:
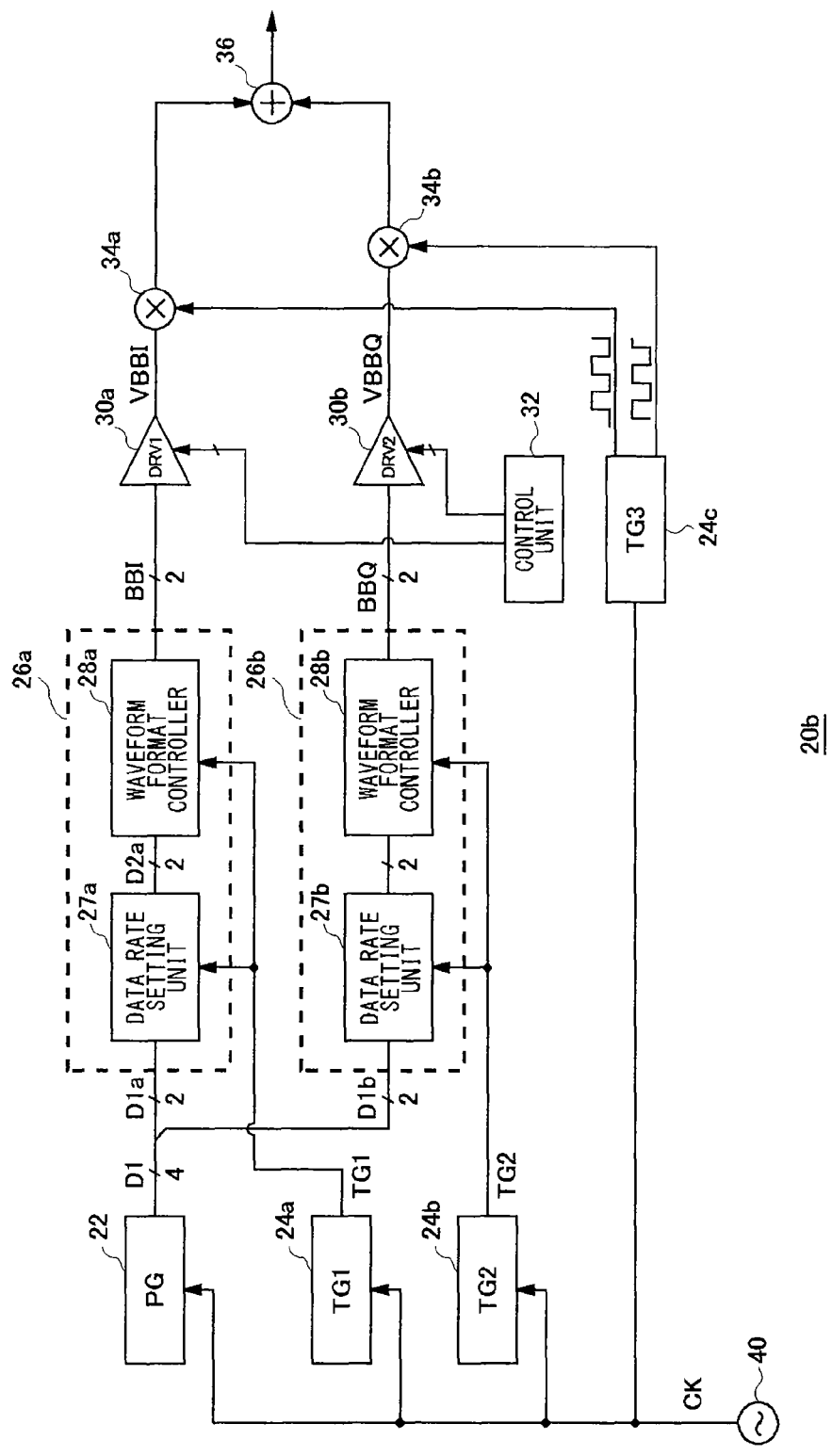
FIG. 6 is a block diagram which shows a configuration of a digital modulator using a rectangular wave signal.

FIG. 6 is a block diagram which shows a configuration of a digital modulator 20b using a rectangular wave signal. The digital modulator 20b shown in FIG. 6 includes a third timing generator 24c instead of the oscillator 42 and the 90-degree phase shifter 44 shown in FIG. 2.

The timing generator mounted on a typical test apparatus has a frequency multiplying function, a phase shifting function, and a function for generating a desired frequency. Thus, by employing the third timing generator 24c, such an arrangement is capable of generating two rectangular pulse signals the phases of which are shifted by ¼ cycle from each other. With such an arrangement, the two rectangular pulse signals thus generated are supplied to the first multiplier 34a and the second multiplier 34b, thereby modulating the rectangular carrier signals.

In a case in which such rectangular pulse signals are used as the carrier signals, such an arrangement provides a smaller circuit scale than an arrangement configured to generate sinusoidal wave carrier signals cos ωt and −sin ωt using the DCO or DDS.

Furthermore, with such an arrangement employing the third timing generator 24c, the phase difference between the two carrier signals having a quadrature relation can be adjusted without changing the amplitude of these carrier signals. Thus, such an arrangement is capable of canceling out only IQ phase mismatch or is capable of actively generating such IQ phase mismatch without involving IQ amplitude mismatch.

Instead of the third timing generator 24c, the DDS 90 shown in FIG. 5 may be employed, with the memory 94 storing data which defines a rectangular pulse signal.

The above is a modification of the digital modulator 20.

Next, description will be made regarding a configuration of the digital demodulator 60.

Figure 7:
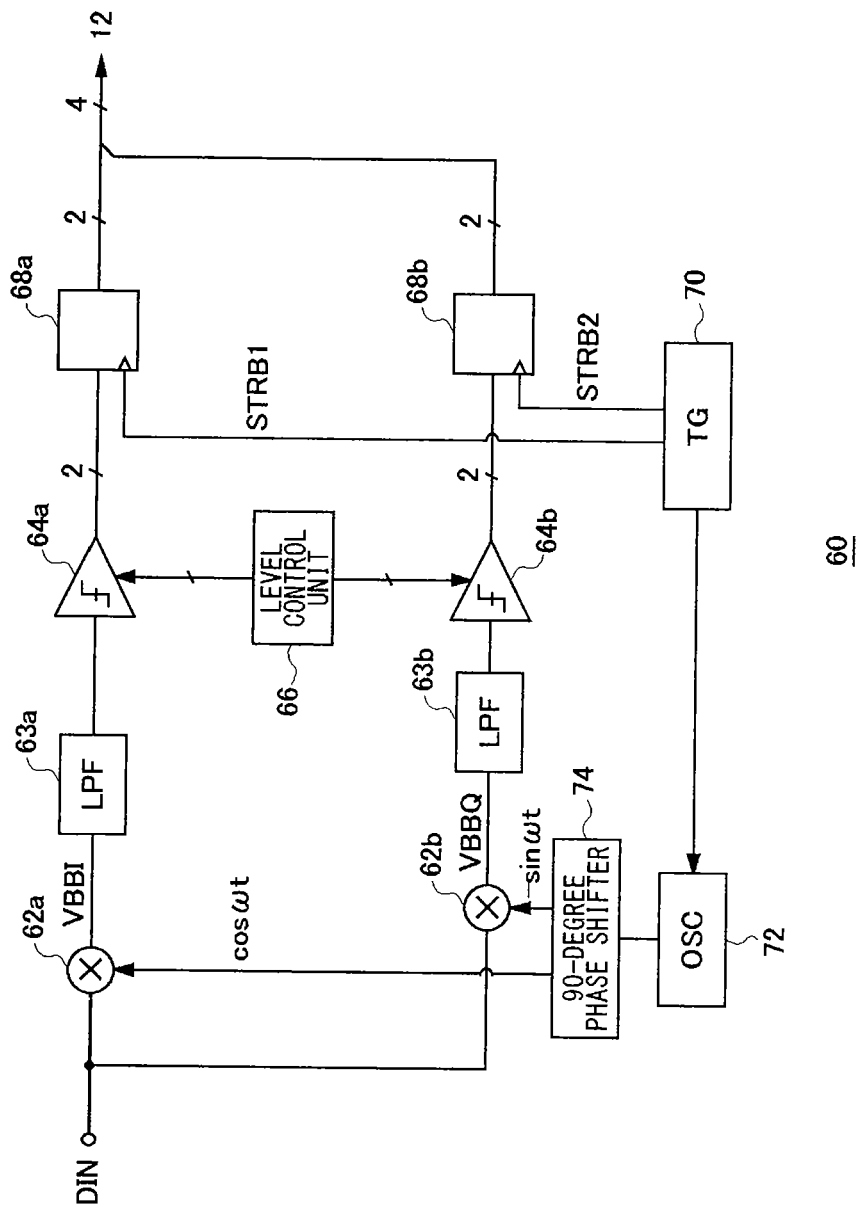
FIG. 7 is a block diagram which shows a digital demodulator according to an embodiment.

FIG. 7 is a block diagram which shows a configuration of the digital demodulator 60 according to an embodiment. The digital demodulator includes a third multiplier 62a, a fourth multiplier 62b, a first low-pass filter 63a, a second low-pass filter 63b, a first comparator 64a, a second comparator 64b, a level control unit 66, a first latch circuit 68a, a second latch circuit 68b, a timing generator 70, an oscillator 72, and a 90-degree phase shifter 74. In FIG. 7, units with an appended lowercase letter "a" are units configured to process the in-phase component, and units with an appended lowercase letter "b" are units configured to process the quadrature component. The timing generator 70 corresponds to the timing generator 16 shown in FIG. 1.

The data Din output from the DUT 110 is input to the third multiplier 62a and the fourth multiplier 62b. The third multiplier 62a and the fourth multiplier 62b multiply the data DIN with an in-phase detection signal cos ωt and a quadrature detection signal −sin ωt, respectively. The third multiplier 62a and the fourth multiplier 62b perform down-conversion of the carrier frequency fc to the baseband frequency (which corresponds to the bit rate).

The block of the oscillator 72 and the 90-degree phase shifter 74 corresponds to the block of the oscillator 42 and the 90-degree phase shifter 44 included in the digital modulator 20 shown in FIG. 2, and generates the detection signals using a reference clock signal generated by the timing generator 70. The phase of the clock signal to be supplied from the timing generator 70 to the oscillator 72 can be adjusted as desired. Thus, such an arrangement allows the phases of the detection signals cos ωt and −sin ωt to be adjusted as desired.

The multi-value digital signal VBBI thus down-converted is low-pass filtered by means of the first low-pass filter 63a, whereby the frequency band of the detection signal is removed. Subsequently, the first comparator 64a compares the resulting multi-value digital signal VBBI with at least one of the threshold voltages VthI1 through VthIM (M represents an integer). The integer M is determined based upon which modulation format is employed, such as 16QAM, 64QAM, QPSK, or the like. In the same way, the baseband signal VBBQ is filtered by the second low-pass filter 63b, whereby the frequency band of the detection signal is removed. Subsequently, the second comparator 64b compares the resulting baseband signal VBBQ with at least one of the threshold voltages VthQ1 through VthQM. In some cases, as the most simple configuration, the low-pass filters 63a and 63b may be each configured as a capacitor arranged between the signal line and the ground line. Also, such a capacitor may be configured as a parasitic capacitance that occurs at the wiring line.

The threshold voltages VthI1 through VthIM set for the first comparator 64a and the threshold voltages VthQ1 through VthQM set for the second comparator 64b are preferably independently adjustable. Each threshold voltage is set by the level control unit 66. The level control unit 66 is configured as a DA converter.

The data which represent the comparison results obtained by the comparators 64a and 64b are input to the first latch circuit 68a and the second latch circuit 68b, respectively. The first latch circuit 68a and the second latch circuit 68b respectively latch the output signals of the comparators 64a and 64b using edges of strobe signals STRB1 and STRB2 generated by the timing generator 70. The output signals of the first latch circuit 68a and the second latch circuit 68b are output to the judgment unit 12 provided as a downstream component.

The frequencies of the strobe signals STRB1 and STRB2 generated by the timing generator 70 are set according to the data rate. Also, the phases of the strobe signals STRB1 and STRB2 can be adjusted as desired.

The above is the configuration of the digital demodulator 60. With the digital demodulator 60 shown in FIG. 7, the input data DIN can be demodulated using a simple configuration. Furthermore, such an arrangement is capable of comparing the demodulated data with an expected value.

Furthermore, by configuring the first comparator 64a and the second comparator 64b such that they have adjustable threshold voltages, such an arrangement is capable of emulating a device which functions as a communication partner of the DUT 110.

If the first comparator 64a and the second comparator 64b are each configured as a window comparator, by adjusting the window width, such an arrangement is capable of providing a mask test in the amplitude direction. In the same way, by limiting, by means of a time-base window, the latch timing determined by the strobe signals STRB1 and STRB2 at which the comparison results are obtained, such an arrangement is capable of providing a mask test in the time direction. By joining together the mask test operations in the amplitude direction and the time direction, such an arrangement is capable of generating a constellation map.

Description has been made in the embodiment regarding an arrangement in which the digital demodulator 60 generates a sinusoidal wave signal as a detection signal used to perform demodulation. Also, as described regarding the digital modulator 20, the digital demodulator 60 may perform demodulation using a rectangular pulse signal. In this case, instead of providing the oscillator 72 and the 90-degree phase shifter 74, a detection signal should be generated using the timing generator in the same way as in the modification shown in FIG. 6. Alternatively, the DDS 90 shown in FIG. 5 may be employed, with the waveform memory 94 storing data which defines such a rectangular pulse signal.

Description has been made regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the embodiment regarding an arrangement in which the digital modulators 20 (digital demodulators 60) are provided in increments of I/O terminals 102, and each digital modulator 20 (digital demodulator 60) includes the pattern generator 22, the timing generator 24, the oscillator 42 (72), the 90-degree phase shifter 44 (74), etc. However, the present invention is not restricted to such an arrangement. That is to say, an arrangement may be made in which one such set of the pattern generator 22, the timing generator 24, the oscillator 42 (72), and the 90-degree phase shifter 44 (74) is provided every predetermined number of channels, and is shared by multiple digital modulators 20 (or the digital demodulators 60).

For example, an arrangement may be made in which a 90-degree phase shifter 44 (74) is provided for each digital modulator 20 in order to control IQ phase mismatch in increments of the digital modulators 20, and an oscillator 42 (72) is shared by multiple digital modulators 20.

Figure 8:
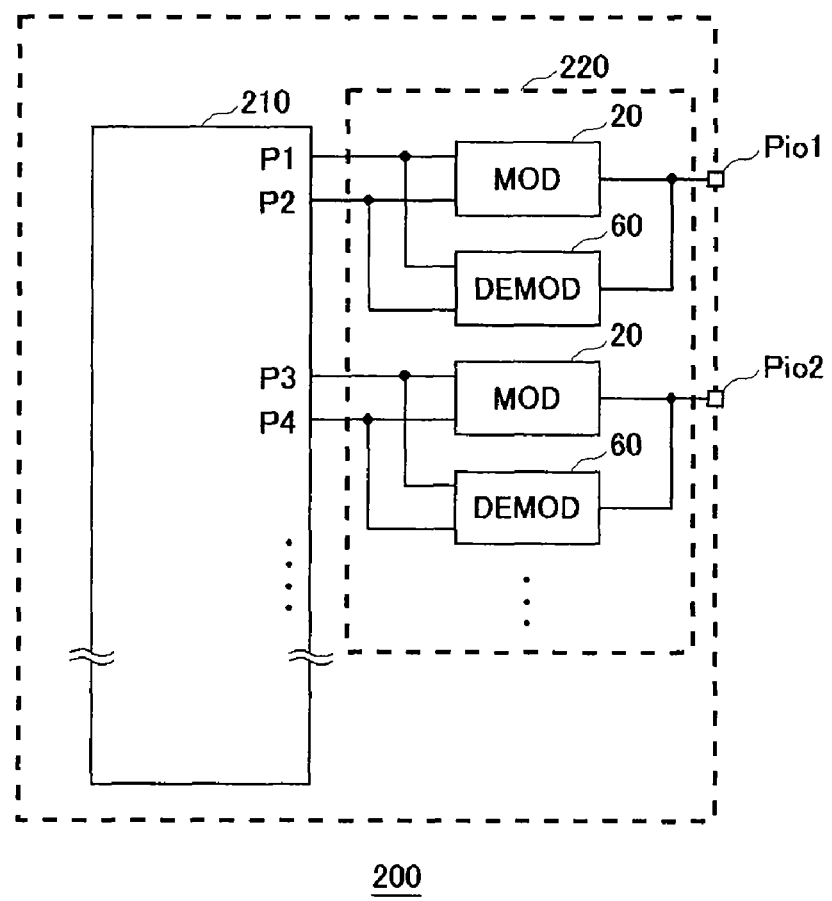
FIG. 8 is a block diagram which shows a configuration of a semiconductor apparatus including digital modulators and digital demodulators according to an embodiment.

Description has been made regarding an arrangement in which the digital modulator 20 and the digital demodulator 60 are mounted on the test apparatus 100. Also, the digital modulator 20 and the digital demodulator 60 may be implemented as an interface of the DUT 110. FIG. 8 is a block diagram which shows a semiconductor apparatus 200 including the digital modulator 20 and the digital demodulator 60 according to an embodiment.

The internal components of the semiconductor apparatus 200 include a function device 200, multiple digital modulators 20, and multiple digital demodulators 60. Furthermore, the semiconductor apparatus 200 includes input/output pins Pio1, Pio2, and so on, which allows the semiconductor apparatus 200 to perform signal transmission with the outside. The function device 210 is memory, MPU, or the like, including input/output pins P1, P2, P3, P4, and so on, which allows binary data to be input and output via these ports.

One set of the digital modulator 20 and the digital demodulator 60 is provided every predetermined number of input/output ports. In an example shown in FIG. 8, one set is provided every two input/output ports. Each digital modulator 20 digitally modulates the data output from the multiple input/output ports of the function device 210, and the data thus digitally modulated is output to an external circuit. Moreover, each digital demodulator 60 demodulates the data input from an external circuit, and outputs the data thus demodulated to the corresponding port of the function device 210.

With an embodiment, the multiple digital modulators 20 and the multiple digital demodulators 60 may be integrated in the function device 210.

With another embodiment, the multiple digital modulators 20 and the multiple digital demodulators 60 may be integrated as an interface module 220 (I/O module) formed on a semiconductor substrate separate from the function device 210.

In a case in which the digital modulators 20 or the digital demodulators 60 according to the embodiment are employed as an interface of a semiconductor device as shown in FIG. 8, such an arrangement does not require a high level of functionality, unlike a test apparatus. Thus, from the functions described with reference to FIGS. 1 through 7, a configuration for providing a function for emulating IQ mismatch can be eliminated. Thus, such an arrangement provides a reduced circuit area, thereby allowing the digital modulators 20 or the digital demodulators 60 to be easily mounted within a semiconductor module.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

The invention claimed is:

1. A test apparatus configured to supply data subjected to digital multi-value modulation to a device under test configured to transmit and receive multiple channels of data subjected to digital multi-value modulation, wherein the test apparatus comprises digital modulators in increments of channels, and wherein the digital modulator comprises: a first baseband signal generator configured to perform retiming of first data input as a modulation signal for an in-phase component using a first timing signal the timing of which can be adjusted, so as to generate a first baseband signal;

a second baseband signal generator configured to perform retiming of second data input as a modulation signal for a quadrature component using a second timing signal the timing of which can be adjusted, so as to generate a second baseband signal;

a first multi-level driver configured to generate a first multi-value digital signal having a level that corresponds to the value of the baseband signal output from the first baseband signal generator;

a second multi-level driver configured to generate a second multi-value digital signal having a level that corresponds to the value of the baseband signal output from the second baseband signal generator;

a first multiplier configured to amplitude-modulate an in-phase carrier signal with the first multi-value digital signal;

a second multiplier configured to amplitude-modulate a quadrature carrier signal with the second multi-value digital signal; and an adder configured to sum the output signals of the first and second multipliers.

2. A test apparatus according to claim 1, wherein the first baseband signal generator comprises a first data rate setting unit configured to convert the bit rate of first data generated by a pattern generator into a bit rate that corresponds to the first timing signal, and wherein the second baseband signal generator comprises a second data rate setting unit configured to convert the bit rate of second data generated by the pattern generator into a bit rate that corresponds to the second timing signal.

3. A test apparatus according to claim 1, wherein the first baseband signal generator comprises a first waveform format controller configured to set a waveform mode for the first baseband signal, and wherein the second baseband signal generator comprises a second waveform format controller configured to set a waveform mode for the second baseband signal.

4. A test apparatus according to claim 1, wherein the first and second multi-level drivers are each configured such that the output level can be adjusted.

5. A test apparatus according to claim 4, wherein the output level of the first multi-level driver and the output level of the second multi-level driver can be independently adjusted.

6. A test apparatus according to claim 3, wherein the first and second multi-level drivers are each configured as an M-level (M=2N) driver configured to receive a baseband signal having an N-bit (N represents an integer) differential format, and wherein the first and second multi-level drivers each include N differential amplifiers, and wherein each differential amplifier comprises: a differential pair configured to receive the baseband signal such that the bits of the baseband signal are input in a differential format;
 a tail current source configured to bias the differential pair; and
 an output load circuit for the differential pair, and wherein the output load circuit is shared by the N differential amplifiers, and wherein tail currents generated by the tail current sources of the N differential amplifiers can be independently controlled.

7. A test apparatus according to claim 1, wherein the first and second multipliers are each configured such that the gains thereof can be independently adjusted.

8. A test apparatus according to claim 1, further comprising: an oscillator configured to generate a carrier signal having a carrier frequency; and
 a phase shifter configured to shift the phase of the carrier signal generated by the oscillator so as to generate the in-phase carrier signal and the quadrature carrier signal.

9. A test apparatus according to claim 8, wherein the phase shifter is configured such that the phase difference between the in-phase carrier signal and the quadrature carrier signal can be adjusted.

10. A test apparatus according to claim 1, wherein the in-phase carrier signal and the quadrature carrier signal are each generated in the form of a rectangular pulse signal.

11. A test apparatus according to claim 1, further comprising: a direct digital synthesizer configured to digitally generate a user-desired signal waveform; and
 a digital/analog converter configured to perform digital/analog conversion of the output data output from the direct digital synthesizer, and to generate the in-phase carrier signal and the quadrature carrier signal.

12. A test apparatus according to claim 1, further comprising a timing generator configured to generate a pulse signal having a frequency and a level transition timing which can be set as desired, wherein the in-phase carrier signal and the quadrature carrier signal are generated by means of the timing generator.

* * * * *